United States Patent
Otremba et al.

(10) Patent No.: US 8,334,586 B2
(45) Date of Patent: Dec. 18, 2012

(54) STACKED SEMICONDUCTOR CHIPS WITH SEPARATE ENCAPSULATIONS

(75) Inventors: Ralf Otremba, Kaufbeuren (DE); Josef Hoeglauer, Munich (DE); Xaver Schloegel, Sachsenkam (DE); Soon Hock Tong, Melaka (MY); Kwai Hong Wong, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/110,372

(22) Filed: May 18, 2011

(65) Prior Publication Data

US 2011/0215460 A1    Sep. 8, 2011

Related U.S. Application Data

(62) Division of application No. 12/173,444, filed on Jul. 15, 2008, now Pat. No. 7,969,018.

(51) Int. Cl.
*H01L 23/02* (2006.01)
*H01L 23/495* (2006.01)

(52) U.S. Cl. ........ 257/686; 257/777; 257/723; 257/724; 257/728; 257/796; 257/684; 257/690; 257/738; 257/737; 257/E23.069; 257/E23.08

(58) Field of Classification Search ................. 257/686, 257/777, 723, 724, 728, 796, 684, 690, 738, 257/737, E23.069, E23.08
See application file for complete search history.

(56) References Cited

U.S. PATENT DOCUMENTS

| | | | |
|---|---|---|---|
| 5,903,049 A | 5/1999 | Mori | |
| 6,359,790 B1 | 3/2002 | Meyer-Berg | |
| 6,657,311 B1 * | 12/2003 | Hortaleza et al. | 257/778 |
| 7,489,044 B2 | 2/2009 | Pu et al. | |
| 7,514,767 B2 * | 4/2009 | Yang | 257/666 |
| 7,564,137 B2 | 7/2009 | Lam | |
| 7,829,989 B2 * | 11/2010 | Sun et al. | 257/686 |
| 8,008,759 B2 * | 8/2011 | Cruz et al. | 257/676 |
| 8,183,677 B2 * | 5/2012 | Meyer-Berg | 257/686 |
| 2004/0012992 A1 | 1/2004 | Koh et al. | |
| 2004/0061221 A1 * | 4/2004 | Schaffer | 257/723 |
| 2004/0262735 A1 | 12/2004 | Higashi et al. | |
| 2005/0110162 A1 | 5/2005 | Meyer-Berg et al. | |
| 2005/0133916 A1 | 6/2005 | Karnezos | |
| 2005/0179128 A1 * | 8/2005 | Shioga et al. | 257/724 |
| 2006/0091518 A1 | 5/2006 | Grafe et al. | |
| 2007/0040260 A1 | 2/2007 | Otremba | |
| 2007/0085187 A1 * | 4/2007 | Sun et al. | 257/686 |
| 2007/0108560 A1 | 5/2007 | Tang et al. | |
| 2007/0187826 A1 | 8/2007 | Shim et al. | |
| 2007/0205495 A1 | 9/2007 | Fernandez et al. | |
| 2007/0215996 A1 | 9/2007 | Otremba | |
| 2007/0228556 A1 | 10/2007 | Hosseini et al. | |
| 2007/0257348 A1 | 11/2007 | Yang | |
| 2008/0006923 A1 | 1/2008 | Otremba | |

(Continued)

OTHER PUBLICATIONS

Office Action mailed Apr. 29, 2010 in U.S. Appl. No. 12/173,444.

(Continued)

*Primary Examiner* — A O Williams
(74) *Attorney, Agent, or Firm* — Dicke, Billig & Czaja, PLLC

(57) ABSTRACT

Stacked semiconductor chips. One embodiment provides a device having a first body. A first power semiconductor chip and first external contact elements is provides. A second body includes a second semiconductor chip and second external contact elements. The second body is placed over the first body. The first external contact elements and the second external contact elements define a first plane.

19 Claims, 10 Drawing Sheets

U.S. PATENT DOCUMENTS

| | | |
|---|---|---|
| 2008/0012110 A1 | 1/2008 | Chong et al. |
| 2008/0017907 A1 | 1/2008 | Otremba |
| 2009/0072413 A1 | 3/2009 | Mahler et al. |
| 2009/0236749 A1* | 9/2009 | Otremba et al. .............. 257/774 |
| 2010/0019391 A1 | 1/2010 | Strzalkowski |
| 2010/0078784 A1 | 4/2010 | Otremba |
| 2011/0215438 A1* | 9/2011 | Kwang et al. ................. 257/531 |

OTHER PUBLICATIONS

Final Office Action mailed Oct. 14, 2010 in U.S. Appl. No. 12/173,444.

* cited by examiner

STACKED SEMICONDUCTOR CHIPS WITH SEPARATE ENCAPSULATIONS

CROSS-REFERENCE TO RELATED APPLICATIONS

This Utility Patent Application is a divisional application of U.S. application Ser. No. 12/173,444, filed Jul. 15, 2008, which is incorporated herein by reference.

BACKGROUND

This invention relates to devices including stacked semiconductor chips and methods to stack semiconductor chips.

For high system integration it is useful to stack integrated circuits, sensors, micromechanical apparatuses or other components one over the each other. The more components are stacked on top of each other within a device, the less area is required on the circuit board to arrange the device.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
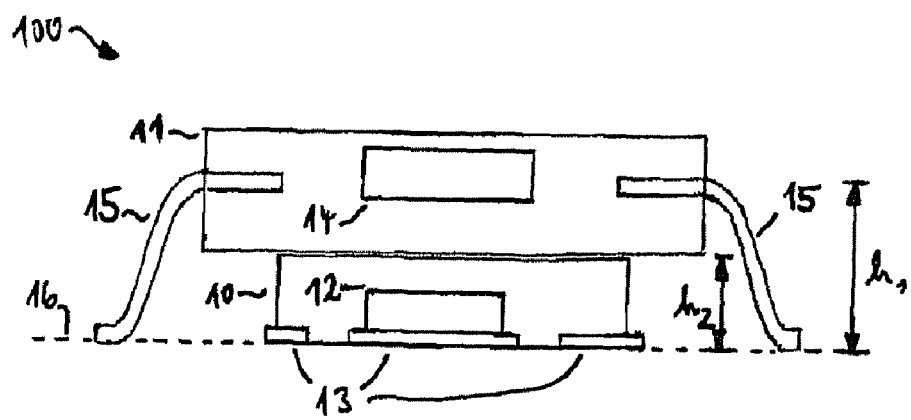
FIG. 1 schematically illustrates one embodiment of a device.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The devices described below may include one or more semiconductor chips. The semiconductor chips may be of extremely different types and may include for example integrated electrical or electro-optical circuits. Some of the semiconductor chips may, for example, be configured as power semiconductor chips, such as power transistors, power diodes or IGBTs (Insulated Gate Bipolar Transistors). Furthermore, the semiconductor chips may include control circuits, driver circuits, microprocessors or microelectromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact pads in one embodiment on its two main surfaces, that is to say on its top side and bottom side. In one embodiment, power transistors, power diodes and IGBTs may have a vertical structure. By way of example, the source electrode and gate electrode of a power transistor and the anode electrode of a power diode may be situated on one main surface, while the drain electrode of the power transistor and the cathode electrode of the power diode are arranged on the other main surface. A power diode may be embodied in one embodiment as a Schottky diode. Furthermore, the devices described below may include integrated circuits to control and/or drive the integrated circuits of other semiconductor chips, for example, the integrated circuits of power transistors or power diodes. The semiconductor chips need not be manufactured from specific semiconductor material, for example Si, SiC, SiGe, GaAs, and, furthermore, may contain inorganic and/or organic materials that are not semiconductors, such as for example discrete passives, antennas, insulators, plastics or metals. Moreover, the semiconductor chips may be packaged or unpackaged.

The semiconductor chips may have contact pads (or electrodes) which allow electrical contact to be made with the integrated circuits included in the semiconductor chips. One or more metal layers may be applied to the contact pads of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main surfaces of the semiconductor chips or on other surfaces of the semiconductor chips.

The semiconductor chips may be placed on carriers. The carriers may be of any shape, size and material. During the fabrication of the devices the carriers may be connected to each other. The carriers may also be made from one piece. The carriers may be connected among each other by connection means with the purpose of separating some of the carriers in the course of the fabrication. Separation of the carriers may be carried out by mechanical sawing, a laser beam, cutting, stamping, milling, etching or any other appropriate method. The carriers may be electrically conductive. They may be fabricated from metals or metal alloys, in one embodiment copper, copper alloys, iron nickel, aluminum, aluminum alloys, or other appropriate materials. The carriers may be, for example, a leadframe or a part of a leadframe. Furthermore, the carriers may be plated with an electrically conductive material, for example copper, silver, iron nickel or nickel phosphorus.

The devices described below include external contact elements or external contact pads, which may be of any shape and size. The external contact elements may be accessible from outside the device and may thus allow electrical contact to be made with the semiconductor chips from outside the device. Furthermore, the external contact elements may be thermally conductive and may serve as heat sinks for dissipating the heat generated by the semiconductor chips. The external contact elements may be composed of any desired electrically conductive material, for example of a metal, such as copper, aluminum or gold, a metal alloy or an electrically conducting organic material. The external contact elements may, for example, be leads of a leadframe, solder balls, solder bumps or contact pads of leadless packages.

The semiconductor chips or at least parts of the semiconductor chips may be covered with an electrically insulating material. The electrically insulating material may be any appropriate laminate (prepreg), duroplastic, thermoplastic or thermosetting material and may contain filler materials. Various techniques may be employed to cover the semiconductor chips with the electrically insulating material, for example lamination, compression molding or injection molding. The electrically insulating material may be used to form bodies containing one or more semiconductor chips or passives.

FIG. 1 schematically illustrates one embodiment of a device 100 in cross section. The device 100 includes a first body 10 and a second body 11 that is placed over the first body 10. The first body 10 contains a first power semiconductor chip 12 and first external contact elements 13. The second body 11 contains a second semiconductor chip 14 and second external contact elements 15. The first external contact elements 13 and the second external contact elements 15 define a first plane 16.

It may, for example, be provided that the remote ends of the first and second external contact elements 13 and 15 define the first plane 16. Furthermore, a height $h_1$ of the second external contact elements 15 in a direction orthogonal to the first plane 16 may be equal to or greater than a height $h_2$ of the first body 10 in the same direction.

In one embodiment, the second body 11 may contain one or more discrete passive components, such as resistors, capacitors or inductors, instead of the second semiconductor chip 14. When it is referred to the second semiconductor chip 14 in the following, the second semiconductor chip 14 may thus be replaced by one or more discrete passive components according to one embodiment.

Figure 2:
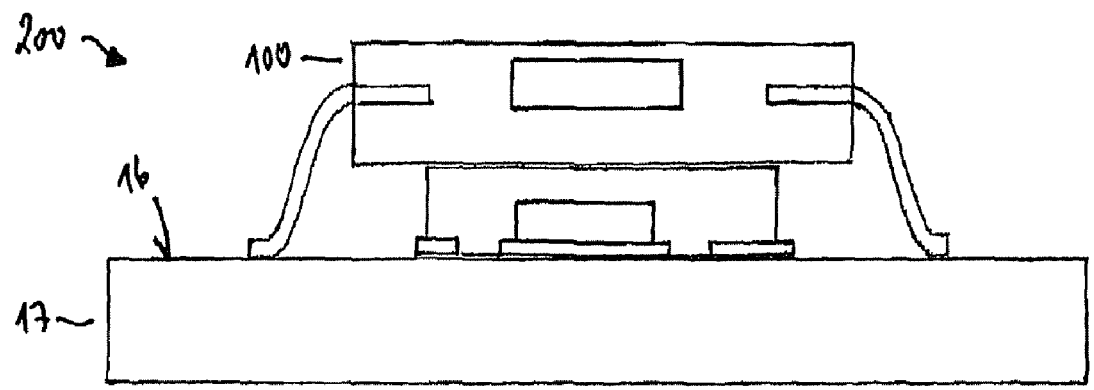
FIG. 2 schematically illustrates one embodiment of a device.

FIG. 2 schematically illustrates one embodiment of a device 200 in cross section. The device 200 includes the device 100 illustrated in FIG. 1 and a circuit board 17. The device 100 is mounted on the circuit board 17 with the remote ends of the first and second external contact elements 13 and 15 being connected to the circuit board 17. In the present embodiment, the first plane 16 defined by the first and second external contact elements 13 and 15 is parallel to the top surface of the circuit board 17 on which the device 100 is mounted. In other words, the first plane 16 is the mounting surface of the device 100.

Figure 3A:
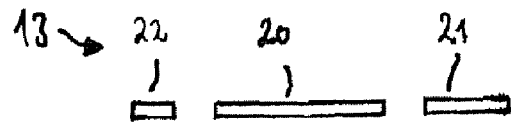
FIGS. 3A to 3D schematically illustrate one embodiment of a method to produce a first body.
Figure 3B:
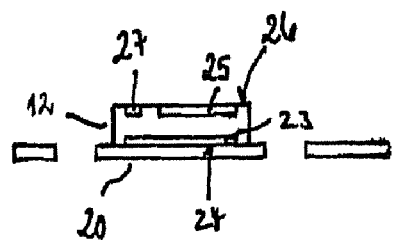
Figure 3C:
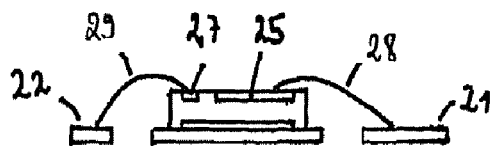
Figure 3D:
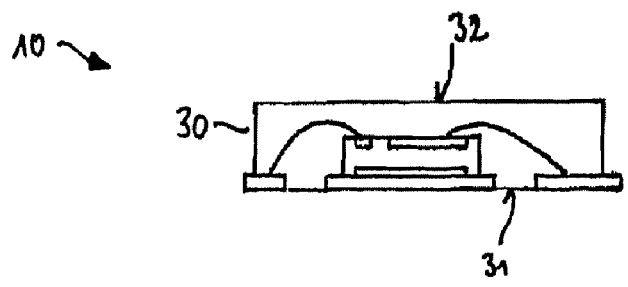

FIGS. 3A to 3D schematically illustrate one embodiment of a method for production of the first body 10, a cross section of which is illustrated in FIG. 3D. The first body 10 illustrated in FIG. 3D is an implementation of the first body 10 illustrated in FIG. 1. The details of the first body 10 that are described below can therefore be likewise applied to the device 100.

In FIG. 3A a leadframe 13 is provided serving as the first external contact element. The leadframe 13 may consist of a die pad 20 and pads 21, 22. The leadframe 13 may contain any number of pads or leads which may be of any shape and size and may be arranged in any desired geometry. The leadframe 13 may be fabricated from metals or metal alloys, in one embodiment copper, iron nickel, or other appropriate materials. The leadframe 13 may be plated with an electrically conductive material, for example copper, silver, iron nickel or nickel phosphorus.

As illustrated in FIG. 3B, the first power semiconductor chip 12 as well as possibly further semiconductor chips are placed over the die pad 20 serving as a carrier for the first power semiconductor chip 12. The first power semiconductor chip 12 may have a first electrode 23 on a first main surface 24 and a second electrode 25 on a second main surface 26 that is opposite to the first main surface 24. The first power semiconductor chip 12 may, for example, be an IGBT, a vertical power diode or a vertical power transistor, for example a power MOSFET. In the latter case, which is exemplarily illustrated in FIG. 3B, the first and second electrodes 23 and 25 may be drain and source electrodes, respectively. Furthermore, the first power semiconductor chip 12 may have a third electrode 27 on the second main surface 26 functioning as a gate terminal in the case the first power semiconductor chip 12 is a power transistor. The first power semiconductor chip 12 is mounted onto the die pad 20 with its first main surface 24 facing the die pad 20. The drain electrode 23 may be electrically connected to the die pad 20. During operation of the first power semiconductor chip 12 voltages higher than 5, 10, 50, 100, 500 or 1000 V may be applied between the drain and source electrodes 23 and 25.

The electrical connection between the drain electrode 23 of the first power semiconductor chip 12 and the die pad 20 may, for example, be produced by reflow soldering, vacuum soldering, diffusion soldering or adhesive bonding by using an electrically conductive adhesive.

If diffusion soldering is used as a connecting technique, it is possible to use solder materials which lead to intermetallic phases after the end of the soldering operation at the interface between the die pad 20 and the first power semiconductor chip 12 on account of interface diffusion processes. In this case, the use of Sn, AuSn, AgSn, CuSn, AgIn, AuIn, CuIn, AuSi or Au solders is conceivable. If the first power semiconductor chip 12 is adhesively bonded to the die pad 20, it is possible to use electrically conductive adhesives which may be based on epoxy resins and be enriched with gold, silver, nickel or copper in order to produce the electrical conductivity.

As illustrated in FIG. 3C, electrical interconnections between the electrodes 25 and 27 located on the second main surface 26 of the first power semiconductor chip 12 and the pads 21 and 22 are made by bond wires 28 and 29, respectively. The bond wires 28 and 29 may, for example, be made up of one of gold, copper and aluminum. Ball bonding, wedge bonding or any other suitable bonding technique may be employed to attach the bond wires 28 and 29 at both ends.

The first power semiconductor chip 12 may be encapsulated by an electrically insulating material 30 as illustrated in FIG. 3D. For example, a duroplastic or thermosetting mold material 30 may be used. The mold material 30 may be based on an epoxy material and may contain a filling material consisting of small particles of glass or other electrically insulating mineral filler material like $Al_2O_3$ or organic filler material. The first body 10 as illustrated in FIG. 3D is a leadless package. The first body 10 has a first surface 31 at which the lower surfaces of the pads 20 to 22 are exposed. These exposed surfaces are the first external contact elements 13. Furthermore, the first body 10 has a second surface 32 which is the upper surface of the electrically insulating material 30.

Figure 4A:
FIGS. 4A to 4E schematically illustrate one embodiment of a method to produce a second body.
Figure 4B:
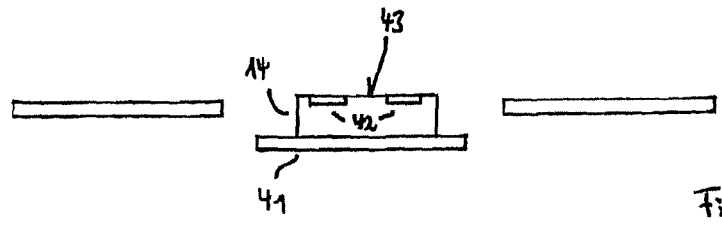
Figure 4C:
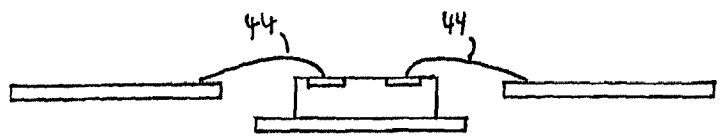
Figure 4D:
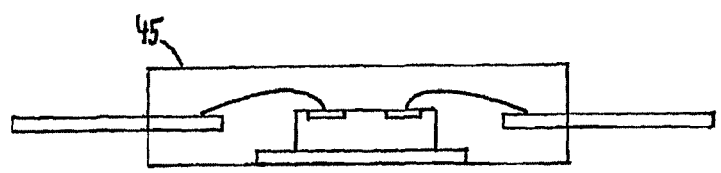
Figure 4E:
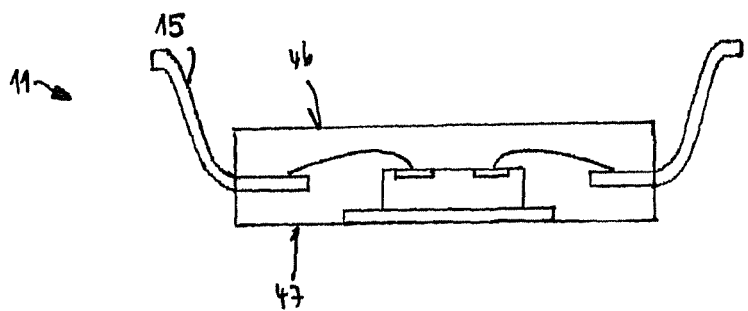

FIGS. 4A to 4E schematically illustrate one embodiment of a method for production of the second body 11, a cross section of which is illustrated in FIG. 4E. The second body 11 illustrated in FIG. 4E is an implementation of the second body 11 illustrated in FIG. 1. The details of the second body 11 that are described below can therefore be likewise applied to the device 100.

In FIG. 4A a leadframe 40 is provided including a die pad 41 and a plurality of leads 15 serving as the second external contact elements. The leadframe 40 may be of any shape and size. The leadframe 40 may be fabricated from a metal or metal alloy, in one embodiment copper, iron nickel, or other appropriate materials. As illustrated in FIG. 4B, the second semiconductor chip 14 as well as possibly further semiconductor chips are attached to the die pad 41. The second semiconductor chip 14 may include a logic circuit, for example a control circuit. As an alternative or additional to the second semiconductor chip 14, one or more discrete passive components may be placed on the die pad 41. The second semiconductor chip 14 may have a number of electrodes 42 on an active main surface 43 which faces away from the die pad 41. The integrated circuit embedded in the second semiconductor chip 14 can be electrically accessed via the electrodes 42. The electrodes 42 may be made of a metal, for example aluminum or copper.

As illustrated in FIG. 4C, bond wires 44 are produced in order to couple the electrodes 42 to the leads 15. The second semiconductor chip 14 may be encapsulated by an electrically insulating material 45 as illustrated in FIG. 4D, for example a duroplastic or thermosetting mold material 45. After the encapsulation the leads 15 may be bent and trimmed as illustrated in FIG. 4E.

The second body 11 as illustrated in FIG. 4E has a third surface 46 defined by the mold material 45 and a fourth surface 47 at which a surface of the die pad 41 may be exposed. The leads 15 protruding from the mold material 45 serve as the second external contact elements.

Figure 5A:
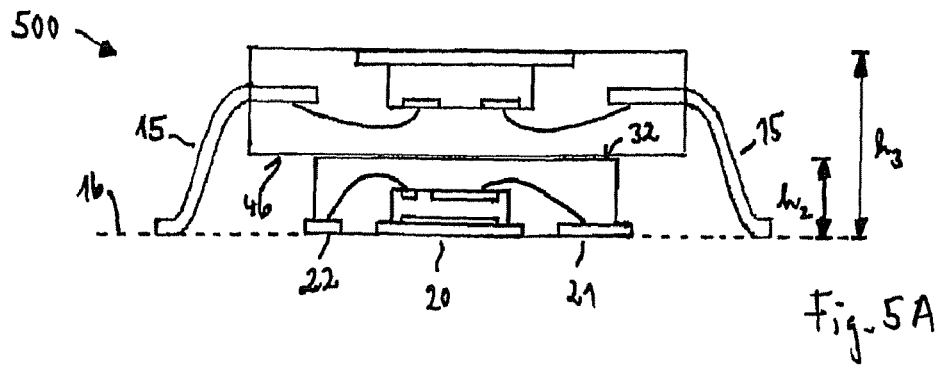
FIGS. 5A to 5C schematically illustrate one embodiment of a method to produce a device and to mount the device on a circuit board.

FIG. 5A schematically illustrates one embodiment of a device 500 which is an implementation of the device 100 illustrated in FIG. 1. The device 500 consists of the first body 10 illustrated in FIG. 3D and the second body 11 illustrated in FIG. 4E mounted on the first body 10 with the surface 32 facing the surface 46. An adhesive material or any other appropriate means may be used to attach the second body 11 to the first body 10. The leads 15 of the second body 11 are sufficiently long to create a space under the surface 46. The first body 10 is arranged in this space formed by the leads 15 and the surface 46. The remote ends of the leads 15 and the bottom surfaces of the pads 20 to 22 are arranged in the first plane 16. The surfaces 31, 32, 46 and 47 are parallel to the first plane 16. When the device 500 is not mounted on the circuit board 17, the first power semiconductor chip 12 and the second semiconductor chip 14 may be electrically insulated from each other. In the present embodiment, the height $h_2$ of the first body 10 may be in the range from 0.5 to 1.5 mm and the height $h_3$ of the device 500 may be in the range from 2.5 to 3.5 mm.

Figure 5B:
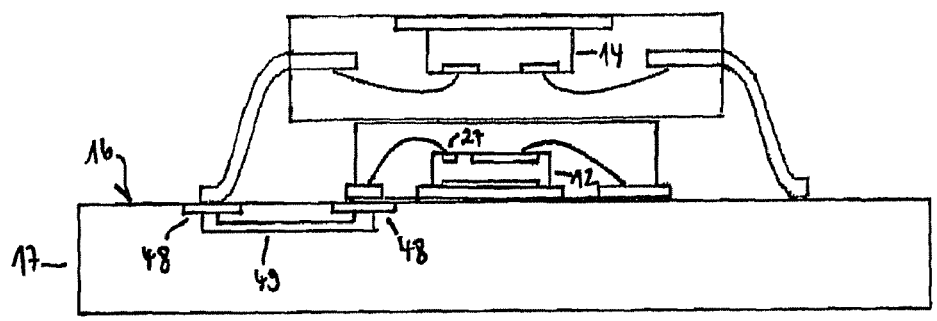
Figure 5C:
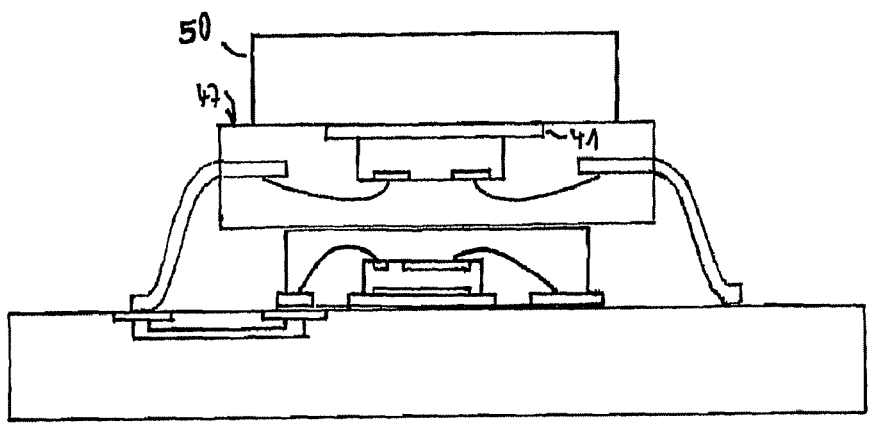

Solder material may be used to electrically couple the first and second external contact elements 13 and 15 to contact pads 48 of the circuit board 17 (only two of the contact pads 48 are illustrated in FIG. 5B). The circuit board 17 may be a PCB (Printed Circuit Board) and may include one or more metal layers 49. The metal layers 49 may electrically couple the first external contact elements 13 to the second external contact elements 15. If the second semiconductor chip 14 is a control semiconductor chip, the second semiconductor chip 14 may be coupled to the gate electrode 27 as illustrated in FIG. 5B in order to drive the gate potential of the first power semiconductor chip 12.

On top of the device 500, a heat sink or cooling element 50 may be attached. The heat sink 50 may be thermally coupled to the die pad 41 exposed at the surface 47. During operation of the device 500, the heat sink 50 dissipates the heat generated by the second semiconductor chip 14. Instead of or additional to the heat sink 50, an air flow may be used to cool the second semiconductor chip 14. The heat generated by the first power semiconductor chip 12 is transferred via the die pad 20 to the circuit board 17 and is dissipated there.

Figure 6A:
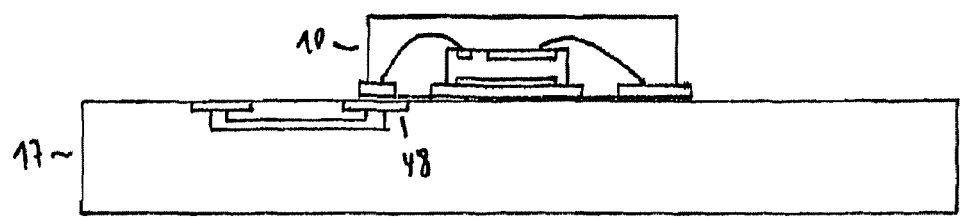
FIGS. 6A to 6C schematically illustrate one embodiment of a method to mount the device on a circuit board.
Figure 6B:
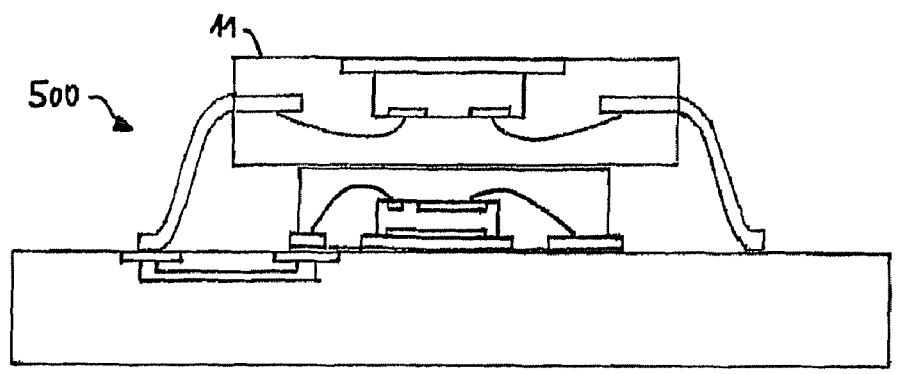
Figure 6C:
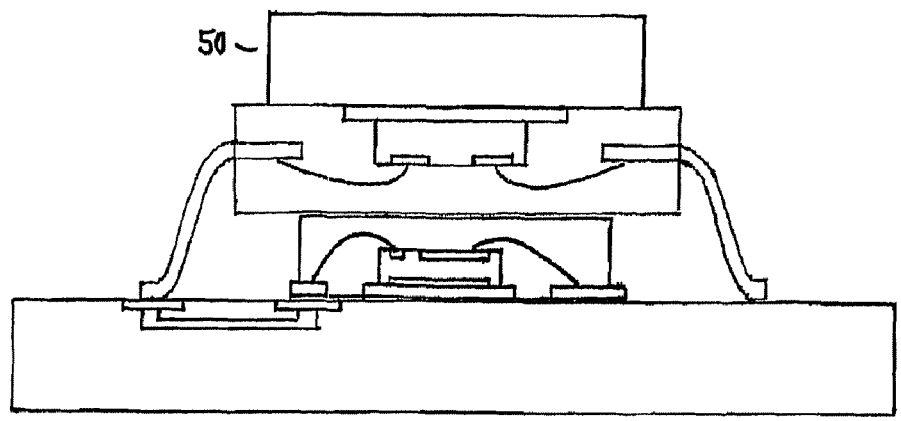

FIGS. 6A and 6B illustrate an alternative approach to mount the device 500 on the circuit board 17. Instead of assembling the device 500 before mounting it on the circuit board 17, the first body 10 is attached to the circuit board first (see FIG. 6A) and afterwards the second body 11 is attached to the circuit board 17 (see FIG. 6B). Furthermore, the heat sink 50 may be placed over the device 500 (see FIG. 6C). In this case, it is not necessary to attach the second body 11 to the first body 10.

It is obvious to a person skilled in the art that the device 500 illustrated in FIG. 5A and the manufacturing thereof as described above are only intended to be an exemplary embodiment, and many variations are possible. For example, more than one semiconductor chip or passives may be included in the first body 10 or the second body 11. The semiconductor chips and passives may differ in function, size, manufacturing technology etc. The first power semiconductor chip 14 may have a lateral structure with the drain, source and gate electrodes being located on the same main surface. Furthermore, the second body 11 may contain no semiconductor chip, but only one or more passives. According to an embodiment, the second semiconductor chip 14 may be a power semiconductor chip. In this case the wiring on the circuit board may connect the two power semiconductor chips 12 and 14 in a half-bridge circuit.

Other types of packages than the ones described above may also be used for the two bodies 10 and 11. The first body 10 may, for example, be a QFN (Quad Flat Non-Leaded), SON (Small Outline Non-Leaded), SOT (Small Outline Transistor) or TSSOP (Thin Shrink Small Outline Plastic) package. The second body 11 may, for example, be a SO (Small Outline) or TSOP (Thin Small Outline Package) package.

Figure 7A:
FIGS. 7A to 7G schematically illustrate one embodiment of a method to produce a first body.
Figure 7B:
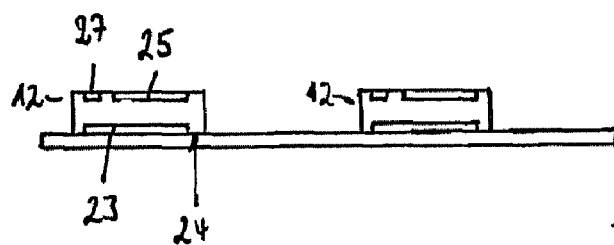
Figure 7C:
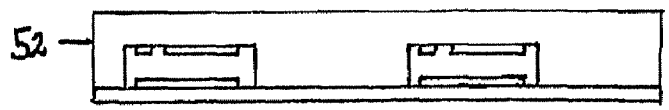
Figure 7D:
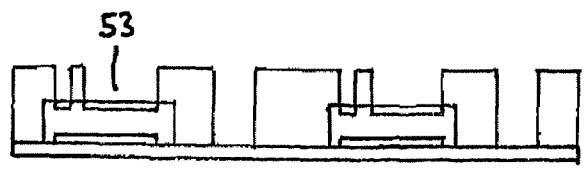
Figure 7E:
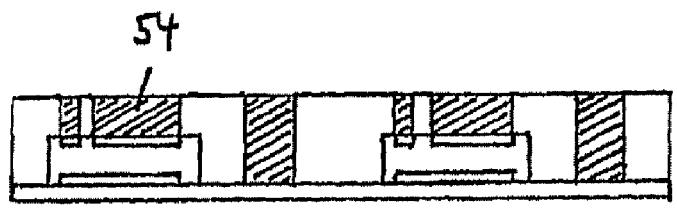
Figure 7F:
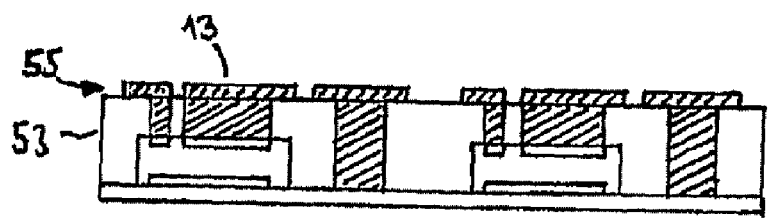
Figure 7G:
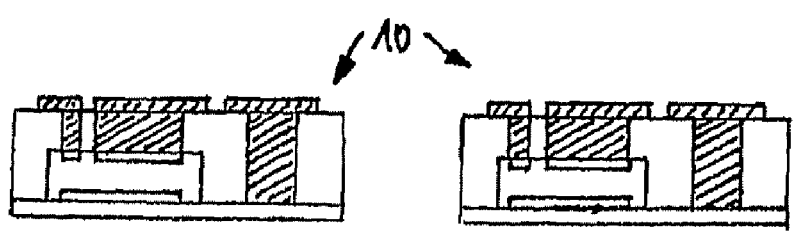

A further type of package which may be used for the first body 10 is illustrated in FIG. 7G. The manufacturing thereof is schematically illustrated in FIGS. 7A to 7G.

In FIG. 7A an electrically conductive carrier 51 is provided. The carrier 51 may be a plate made of a rigid material and may have a flat surface on which the components of the first body 10 to be fabricated may be placed. The shape of the carrier 51 is not limited to any size or geometric shape, for example the carrier 51 may be round or square-shaped. The carrier 51 may, for example, be fabricated from copper, aluminum, iron nickel or any other metal or metal alloy.

As illustrated in FIG. 7B, two first power semiconductor chips 12 as well as possibly further semiconductor chips are placed over the carrier 51. The first power semiconductor chips 12 as well as all other semiconductor chips described herein may have been fabricated on a wafer made of semiconductor material. After dicing the wafer and thereby separating the individual first power semiconductor chips 12, the first power semiconductor chips 12 are relocated on the carrier 51 in larger spacings as they have been in the wafer bond. The first power semiconductor chips 12 may have been manufactured on the same wafer, but may in one embodiment have been manufactured on different wafers. Furthermore, the first power semiconductor chips 12 may be physically identical, but may also contain different integrated circuits.

The first power semiconductor chips 12 are mounted onto the carrier 51 with their first main surfaces 24 facing the carrier 51. The drain electrodes 23 may be electrically coupled to the carrier 51 by reflow soldering, vacuum soldering, diffusion soldering, adhesive bonding by using an electrically conductive adhesive or any other appropriate technique.

An electrically insulating layer 52 is deposited on the carrier 51 and the first power semiconductor chips 12 as illustrated in FIG. 7C. The electrically insulating layer 52 may be laminated as a foil or sheet onto the underlying structures by applying vacuum as well as heat and pressure for a suitable time. It may also be provided that an electrically insulating material is deposited from a solution or a gas phase and may be built-up in a layer-by-layer fashion to a desired thickness. Techniques that can be employed for this kind of deposition are, for example, physical or chemical vapor deposition, spinning, dispensing, dipping, injection molding or compression molding. The electrically insulating layer 52 may be fabricated from a polymer, such as parylene, a photoresist material, a silicone, a mold material or an inorganic, ceramic-like material, such as silicone-carbon compounds.

The electrically insulating layer 52 may be structured as illustrated in FIG. 7D. A plurality of cutouts or through-holes 53 are created in the electrically insulating layer 52 to expose at least portions of the source electrodes 25 and the gate electrodes 27 of the first power transistors 12 as well as portions of the upper surface of the carrier 51 so that electrical connections can be made to those exposed regions. The electrically insulating layer 52 may, for example, be structured by a stamping process, laser ablation, etching, photo-lithographic structuring or any other suitable process known to a person skilled in the art.

The through-holes 53 produced in the electrically insulating layer 52 may be filled with an electrically conductive material in order to form through-connections 54 in the electrically insulating layer 52 as illustrated in FIG. 7E. The electrically conductive material may be a metal, such as copper or aluminum, or a metal alloy.

The electrically conductive material may be deposited in the through-holes 53 by using a galvanic deposition method. For that, a seed layer is first deposited. The seed layer usually has a thickness of some hundred nanometers. Materials such as palladium or titanium may be used for the seed layer.

The thickness of the seed layer may be increased by depositing a further layer of an electrically conductive material onto the seed layer. For example, a layer of copper may be electroless deposited onto the seed layer. This copper layer may have a thickness of less than 1 μm. Afterwards another layer of copper may be galvanically deposited in order to fill the through-holes 53 with the electrically conductive material. The electroless copper deposition may also be omitted.

The electrically insulating layer 52 acts as a platform for the deposition of an electrically conductive layer 55 (see FIG. 7F). The electrically conductive layer 55 may be deposited using the same or similar methods and materials as presented above for the deposition of the electrically conductive material in the through-holes 53, for example plating processes. The electrically conductive layer 55 may have a thickness of more than 10 μm. The electrically conductive layer 55 may be structured to form the first external contact elements 13. The first external contact elements 13 are electrically coupled to the drain electrode 23, the source electrode 25 and the gate electrode 27 of the first power semiconductor chips 12 via the through-connections 54. The first external contact elements 13 may extend over the outlines of the first power semiconductor chips 12. The first external contact elements 13 allow to electrically contact the first power semiconductor chips 12 from outside the first bodies 10. It may also be provided that a redistribution layer is applied to the electrically insulating layer 52 including one or more wiring layers embedded in one or more dielectric layers.

As illustrated in FIG. 7G, the two first power semiconductor chips 12 are separated from one another by separation of the carrier 51 and the electrically insulating layer 52, for example by sawing, etching or a laser beam.

Figure 8A:
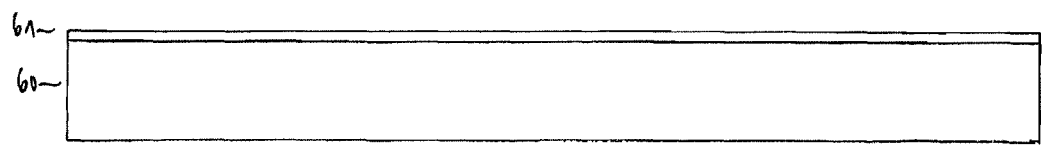
FIGS. 8A to 8I schematically illustrate one embodiment of a method to produce a second body.
Figure 8B:
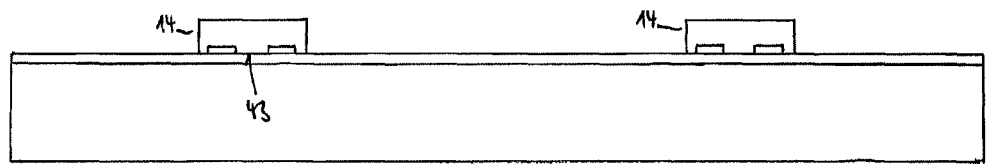
Figure 8C:
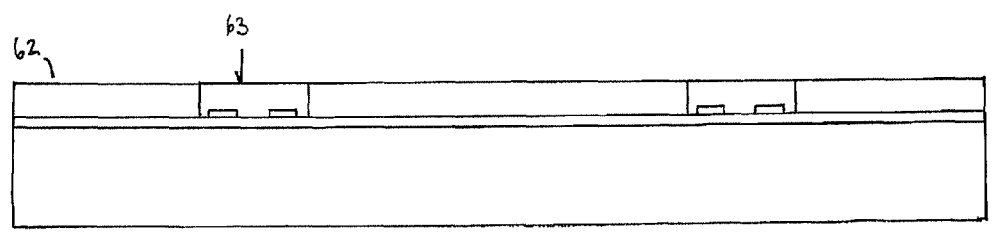
Figure 8D:
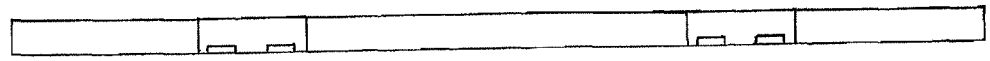
Figure 8E:
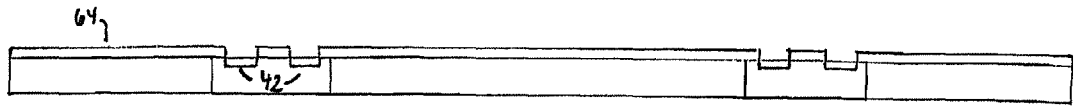
Figure 8F:
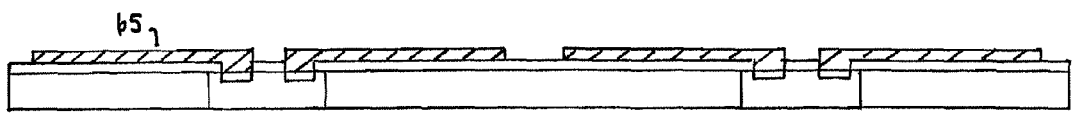
Figure 8G:
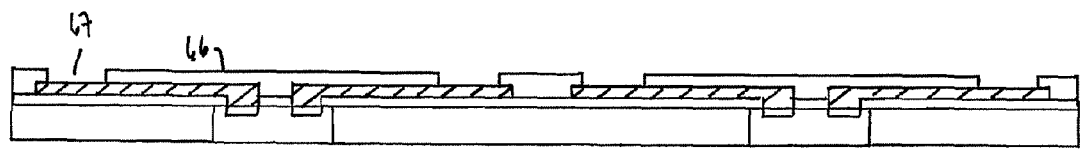
Figure 8H:
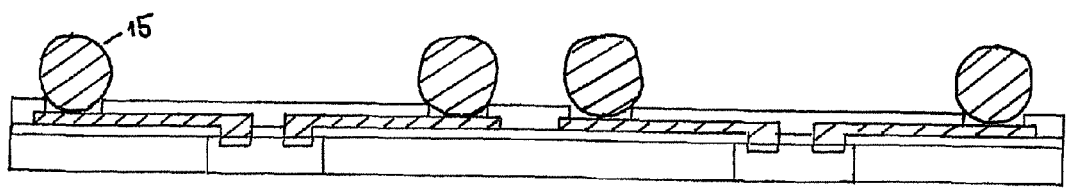
Figure 8I:
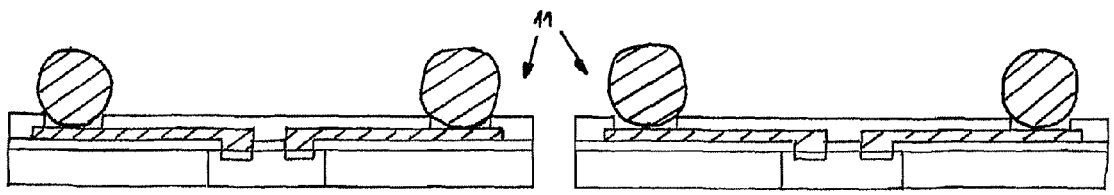

A further type of package which may be used for the second body 11 is illustrated in FIG. 8I. The manufacturing thereof is schematically illustrated in FIGS. 8A to 8I.

In order to manufacture the second body 11 illustrated in FIG. 8I, a carrier 60 is provided (see FIG. 8A). The carrier 60 may be a plate made of a rigid material, for example a metal, such as nickel, steel or stainless steel, laminate, film or a material stack.

The carrier 60 may have at least one flat surface on which components of the second body 11 can be placed. The shape of the carrier 60 is not limited to any geometric shape, for example the carrier 60 may be round or square-shaped. The carrier 60 may have any appropriate size. An adhesive tape 61, for example a double sided sticky tape, may be laminated onto the carrier 60.

As illustrated in FIG. 8B, two second semiconductor chips 14 as well as possibly further semiconductor chips are placed over the carrier 60. The second semiconductor chips 14 can be fixed on the adhesive tape 61. For attaching the second semiconductor chips 14 to the carrier 60, other kinds of attaching materials may in one embodiment be used. The second semiconductor chips 14 may be arranged in an array.

The second semiconductor chips 14 are relocated on the carrier 60 in larger spacing as they have been in the wafer bond. The second semiconductor chips 14 may have been manufactured on the same semiconductor wafer, but may in one embodiment have been manufactured on different wafers. The second semiconductor chips 14 may be arranged over the carrier 60 with their active main surfaces 43 facing the carrier 60.

After the second semiconductor chips 14 have been mounted on the carrier 60, they are encapsulated by an electrically insulating material 62 thereby forming an layer of the electrically insulating material 62, which fills the gaps between the second semiconductor chips 14 as illustrated in FIG. 8C. For example, the electrically insulating material 62 may be a duroplastic or thermosetting mold material. It may be provided that the backsides 63 of the second semiconductor chips 14, which are the main surfaces opposite to the active main surfaces 43, are exposed from the mold material 62. In one embodiment, the surfaces 63 may be covered with the mold material 62. The mold material 62 may be based on an epoxy material and may contain a filling material consisting of small particles of glass ($SiO_2$) or other electrically insulating mineral filler materials like $Al_2O_3$ or organic filler materials.

As an alternative to the mold material, another polymer material may be used as the electrically insulating material 62 to encapsulate the second semiconductor chips 14. The polymer material 62 may have the shape of an electrically insulating foil or sheet, which is laminated on the carrier 62 and optionally on top of the second semiconductor chips 14. Heat and pressure may be applied for a time suitable to attach the polymer foil or sheet 62 to the underlying structure. The polymer material 62 may, for example, be a prepreg (short for preimpregnated fibers) that is a combination of a fiber mat, for example glass or carbon fibers, and a resin, for example a duroplastic material. Prepreg materials are usually used to manufacture PCBs.

The second semiconductor chips 14 encapsulated in the electrically insulating material 62 are released from the carrier 60, and the adhesive tape 61 is pealed from the second semiconductor chips 14 as well as from the electrically insulating material 62 as illustrated in FIG. 8D. The adhesive tape 61 may feature thermo-release properties, which allow the removal of the adhesive tape 61 during a heat-treatment. The removal of the adhesive tape 61 from the carrier 60 is carried out at an appropriate temperature, which depends on the thermo-release properties of the adhesive tape 61 and is usually higher than 150° C.

After the release of the carrier 60 and the adhesive tape 61 the active main surfaces 43 of the second semiconductor chips 14 as well as the bottom surface of the electrically insulating material 62 form a common planar surface. As illustrated in FIGS. 8E to 8G, a redistribution layer may be applied to this surface.

In the present embodiment, the redistribution layer includes a dielectric layers 64, a metal layer 65 and a dielectric layer 66. The dielectric layer 64 is deposited on the planar surface formed by the active main surfaces 43 of the second semiconductor chips 14 and the electrically insulating material 62. The metal layer 65 is applied to the dielectric layer 64, with electrical contacts being produced to the electrodes 42 that are embedded in the active main surfaces 43 of the second semiconductor chips 14. The dielectric layer 64 has openings in order to produce these contacts. The metal layer 65 may have the function of a wiring layer to couple the second semiconductor chips 14 to other components. Instead of only one wiring layer, it is also possible to use more than one wiring layer if required.

The dielectric layer 66 is subsequently applied to the dielectric layer 64 and the metal layer 65. The dielectric layer 66 is opened in areas where external contact pads 67 are arranged.

The dielectric layers 64 and 66 may be fabricated in various ways. For example, the dielectric layers 64 and 66 can be deposited from a gas phase or from a solution, or can be laminated. Furthermore, thin-film technology methods or a standard PCB industry process flow can be used for the application of the dielectric layers 64 and 66. Each of the dielectric layers 64 and 66 may be up to 10 μm thick. In order to make electrical contacts, the dielectric layers 64 and 66 may, for example, be opened by using photolithographic methods and/or etching methods.

The metal layer 65 may, for example, be fabricated by using metallization followed by structuring of the metallization layer in order to form the conductor tracks of the wiring layer. Any desired metal, for example aluminum, nickel, palladium, silver, tin, gold or copper, or metal alloys may be used as the material.

The metal layer 65 may also be generated galvanically. For that, usually a seed layer, for example, a palladium layer, is deposited first, which may be carried out electroless or by using an ink jet printing technique. The seed layer can then be used as an electrode for the galvanic deposition of a further electrically conductive layer, for example a copper layer.

Another technique that may be employed to generate the metal layer 65 is laser direct structuring. In case of laser direct structuring an electrically insulating polymer foil is placed onto the active main surfaces 43 and the electrically insulating material 62. The circuit definition is done by using a laser beam, which activates special additives in the polymer foil in order to allow subsequent selective plating.

Solder deposits serving as the second external contact elements 15 may be placed onto the external contact pads 67 as illustrated in FIG. 8H. The solder deposits 15 may be applied to the redistribution layer by "ball placement", in which preshaped balls composed of solder material are applied to the metal layer 65. As an alternative to "ball placement", the solder deposits may, for example, be applied by using stencil printing with a solder paste, followed by a heat-treatment process. The solder material may be formed from metal alloys which are composed, for example, from the following materials: SnPb, SnAg, SnAgCu, SnAgCuNi, SnAu, SnCu and SnBi. The dielectric layer 66 may be a solder resist layer that prevents solder from bridging between the conductor tracks and creating short circuits. The dielectric layer 66 also provides protection from the environment.

As illustrated in FIG. 8I, the second bodies 11 are separated from one another by separation of the electrically insulating material 62 and the redistribution layer, for example by sawing, etching or a laser beam.

The second bodies 11 manufactured by the method illustrated in FIGS. 8A to 8I may be fan-out type packages. The layer of the electrically insulating material 62 allows the redistribution layer to extend beyond the outline of the second semiconductor chip 14. The external contact pads 67 therefore do not need to be arranged within the outline of the second semiconductor chip 14, but can be distributed over a larger area. The increased area which is available for arrangement of the external contact pads 67 as a result of the layer of the electrically insulating material 62 means that the external contact pads 67 cannot only be arranged at a great distance from one another, but that the maximum number of external contact pads 67 which can be arranged there is likewise increased compared to the situation when all the external contact pads 67 are arranged within the outline of the second semiconductor chip 14.

Figure 9A:
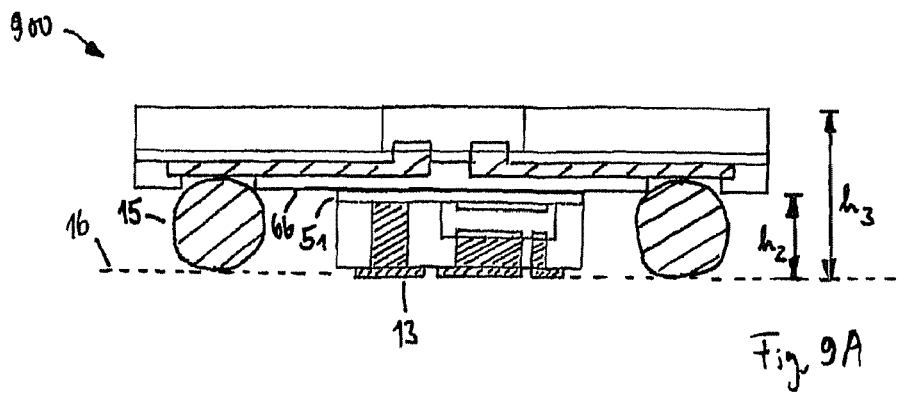
FIGS. 9A to 9C schematically illustrate one embodiment of a method to produce a device and to mount the device on a circuit board.

FIG. 9A schematically illustrates a device 900 which is an implementation of the device 100 illustrated in FIG. 1. The device 900 consists of the first body 10 illustrated in FIG. 7G and the second body 11 illustrated in FIG. 8I mounted on the first body 10 with the dielectric layer 66 facing the carrier 51. An adhesive material or any other appropriate means may be used to attach the second body 11 to the first body 10. The diameter of the solder balls 15 of the second body 11 is sufficiently large to create a space under the dielectric layer 66. The first body 10 is arranged in this space formed by the solder balls 15 and the dielectric layer 66. The remote ends of the first external contact elements 13 and the second external contact elements 15 are arranged in the first plane 16. When the device 900 is not mounted on the circuit board 17, the first power semiconductor chip 12 and the second semiconductor chip 14 may be electrically insulated from each other. In the present embodiment, the height $h_2$ of the first body 10 (and the diameter of the solder balls 15) may be in the range from 0.2 to 0.5 mm and the height $h_3$ of the device 900 may be in the range from 0.7 to 1.3 mm.

The first and second external contact elements 13 and 15 may be attached to contact pads 48 of the circuit board 17

Figure 9B:
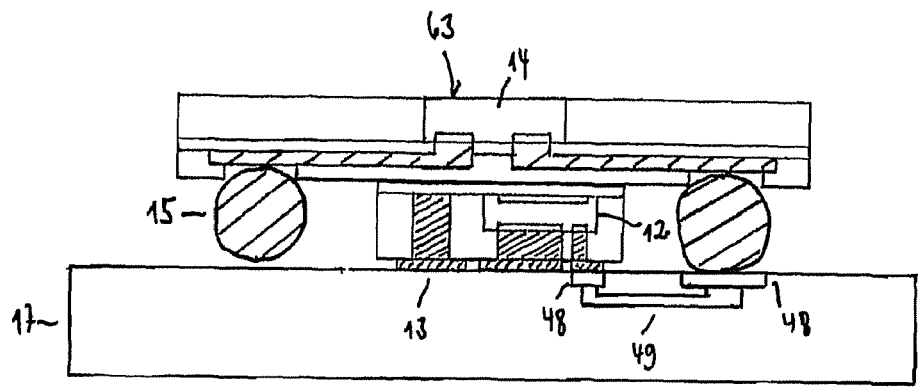
Figure 9C:
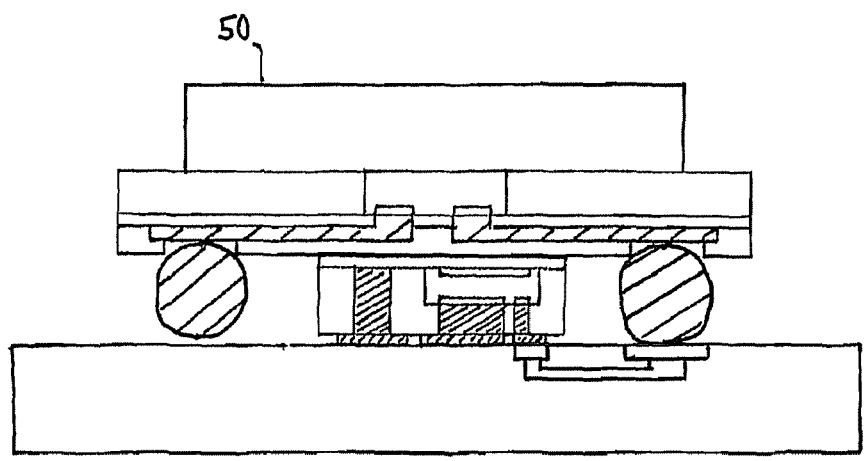

(only two of the contact pads 48 are illustrated in FIG. 9B). The circuit board 17 may be a PCB and may include one or more metal layers 49. The metal layers 49 may electrically couple the first external contact elements 13 to the second external contact elements 15. If the second semiconductor chip 14 is a control semiconductor chip, the second semiconductor chip 14 may be coupled to the gate electrode 27 of the first power semiconductor chip 12 as illustrated in FIG. 9B in order to drive the gate potential of the first power semiconductor chip 12.

On top of the device 900, a heat sink or cooling element 50 may be attached. The heat sink 50 may be thermally coupled to the exposed backside 63 of the second semiconductor chip 14. During operation of the device 900, the heat sink 50 dissipates the heat generated by the second semiconductor chip 14. Instead of or additional to the heat sink 50, an air flow may be used to cool the second semiconductor chip 14. The heat generated by the first power semiconductor chip 12 is at least partially transferred via the first external contact elements 13 to the circuit board 17 and is dissipated there.

Similar to FIGS. 6A and 6B, the first body 10 may also be attached to the circuit board 17 first and afterwards the second body 11 may be attached to the circuit board 17. According to one embodiment, a BGA (Ball Grid Array) package or any other suitable package may be used as the second body 11 in the device 900. The second body 11 may include solder balls as second external contact elements 15 which surround the first body 10 arranged below the second body 11. Furthermore, the first body 10 as illustrated in FIG. 3D or any other suitable package may be included in the device 900 instead of the first body 10 of FIG. 7G.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
    a first body comprising a first power semiconductor chip embedded in a first encapsulation and having first external contact elements on a major surface of the first body; and
    a second body comprising a second semiconductor chip embedded in a second encapsulation separate from the first encapsulation and having second external contact elements electrically isolated from the first external contact elements, wherein:
    the second external contact elements comprise solder deposits extending from a major surface of the second body within a perimeter boundary of the second encapsulation,
    the second body placed over the first body, and
    the first external contact elements and the solder deposits define a first plane.

2. The device of claim 1, comprising wherein the solder deposits are solder balls.

3. The device of claim 1, comprising wherein remote ends of the first external contact elements and the solder deposits define the first plane.

4. The device of claim 1, comprising wherein a height of the solder deposits is equal to or greater than a height of the first body.

5. The device of claim 1, wherein the first body comprises a first carrier and the first power semiconductor chip is attached to the first carrier.

6. The device of claim 5, comprising wherein the first carrier is electrically conductive.

7. The device of claim 5, comprising wherein the first carrier is at least partially exposed at a first surface of the first body.

8. A device, comprising:
    a first body comprising a first power semiconductor chip and first external contact elements; and
    a second body comprising a second semiconductor chip and second external contact elements, the second external contact elements electrically isolated from the first external contact elements, wherein
    the second external contact elements comprise solder deposits,
    the second body is placed over the first body, and
    the first external contact elements and the solder deposits define a first plane for mounting to an device, wherein the first power semiconductor chip has a first electrode on a first main surface and a second electrode on a second main surface opposite the first main surface.

9. The device of claim 1, comprising wherein the second semiconductor chip is a second power semiconductor chip.

10. The device of claim 1, comprising wherein the second semiconductor chip is a control semiconductor chip.

11. The device of claim 1, comprising wherein the first power semiconductor chip is electrically insulated from the second semiconductor chip.

12. The device of claim 1, comprising wherein the first and second bodies are mounted on a circuit board.

13. The device of claim 12, comprising wherein a surface of the circuit board is arranged in the first plane.

14. A device, comprising:
    a first body comprising a first power semiconductor chip and first external contact elements; and
    a second body comprising a second semiconductor chip and second external contact elements, wherein
    the second external contact elements comprise solder deposits, the second body is placed over the first body, and the first external contact elements and the solder deposits define a first plane;

wherein the first and second bodies are mounted on a circuit board, and wherein the circuit board comprises at least one metal layer electrically coupling the first external contact elements to the second external contact elements.

15. The device of claim 14, wherein the first power semiconductor chip comprises a control electrode and the at least one metal layer electrically couples the second semiconductor chip to the control electrode.

16. The device of claim 1, comprising wherein an adhesive material attaches the first body to the second body.

17. A device, comprising:

a first body comprising a first encapsulation embedding a first power semiconductor chip and having first external contact elements; and a second body comprising a second encapsulation embedding a second semiconductor chip and having second external contact elements, wherein the second external contact elements are solder balls, the second body is placed over the first body, the first and second encapsulations are separate from one another, the first external contact elements and the solder balls are electrically isolated from each other and define a first plane, and the first power semiconductor chip has a first electrode on a first main surface and a second electrode on a second main surface opposite the first main surface.

18. A device, comprising:

a circuit board;

a first body comprising a first power semiconductor chip placed over the circuit board;

a second body comprising a second semiconductor chip placed over the first body; and solder deposits extending from the circuit board to the second body, wherein the circuit board comprises at least one metal layer electrically coupling the first power semiconductor chip to the second semiconductor chip.

19. A device, comprising:

a circuit board;

a first body comprising a first power semiconductor chip placed over the circuit board;

a second body comprising a second semiconductor chip placed over the first body;

solder deposits extending from the circuit board to the second body; and a cooling element placed over the second body.

* * * * *